United States Patent
Wang

[11] Patent Number: 6,118,656
[45] Date of Patent: Sep. 12, 2000

[54] HEAT SINK HAVING A PRESSURE GRADIENT

[75] Inventor: Ray Wang, Austin, Tex.

[73] Assignee: Dell USA, LP, Round Rock, Tex.

[21] Appl. No.: 09/102,798

[22] Filed: Jun. 23, 1998

[51] Int. Cl.[7] .................................................. H05K 5/00
[52] U.S. Cl. ............................................................ 361/687
[58] Field of Search ................................... 165/146, 185, 165/80.3; 361/704, 703, 709, 710, 690, 691, 697, 695; 257/722; 174/16.3

[56] References Cited

U.S. PATENT DOCUMENTS

| | | | |
|---|---|---|---|
| 5,304,735 | 4/1994 | Earl et al. | 174/16.3 |
| 5,406,451 | 4/1995 | Korinsky . | |
| 5,452,181 | 9/1995 | Hoover . | |
| 5,471,027 | 11/1995 | Call et al. | 219/85.13 |
| 5,504,652 | 4/1996 | Foster et al. . | |
| 5,584,339 | 12/1996 | Hong . | |
| 5,986,887 | 11/1999 | Smith et al. | 361/704 |
| 5,991,151 | 11/1999 | Capriz | 361/704 |
| 6,011,689 | 1/2000 | Wrycraft | 361/695 |

*Primary Examiner*—Leo P. Picard
*Assistant Examiner*—Tung Minh Bui
*Attorney, Agent, or Firm*—Haynes and Boone, LLP

[57] ABSTRACT

A heat sink having a pressure gradient includes a heat sink base plate. Individual fins extend from the base plate and have variable spacing. First adjacent fins form a high pressure zone at a first end of the heat sink, wherein the first adjacent fins are separated by a first distance therebetween. Second adjacent fins form a low pressure zone at a second end of the heat sink, opposite the first end, wherein the second adjacent fins are separated by a second distance, greater than the first distance.

16 Claims, 3 Drawing Sheets

HEAT SINK HAVING A PRESSURE GRADIENT

BACKGROUND

The disclosures herein relate generally to heat sinks used in a computer chassis and more particularly to a heat sink having variably spaced fins providing a pressure gradient to enhance natural convection cooling.

The many electrical components in a computer chassis create excessive heat which must be removed to keep the system functioning. Many heat removal schemes are used in this environment including fans, heat sinks and combinations thereof. Heat sinks are often mounted in an abutting relationship with a thermal plate, such as that provided on a microprocessor module, which conducts heat from the module to the heat sink.

In U.S. Pat. No. 5,406,451 a computer system utilizes a heat sink which optimizes the benefits of both linear airflow and turbulent airflow within the computer housing. The heat sink has rows of metal fingers extending from a metal sheet. A fan generates linear airflow within the housing. The heat sink is attached to a heat producing element such that the rows of fingers are placed parallel to the direction of airflow in the housing. The fingers are spaced apart within a single row to generate turbulence in the airflow, and the rows are spaced apart to prevent the turbulence of one row from interfering with the turbulence of an adjacent row.

In U.S. Pat. No. 5,452,181 an apparatus for cooling an integrated circuit device has a fan detachably mounted to a heat sink, and the heat sink is in turn mounted to an exposed surface of the integrated circuit. The heat sink includes a pair of mounting posts, and the fan assembly includes corresponding mounting recesses for receiving the mounting posts. The mounting recesses are dimensioned to form an interference fit with the corresponding mounting posts, in order to retain the mounting posts within the mounting recesses. Alternatively, the fan assembly has biased tabs, which are received within corresponding recesses formed on the integrated circuit device to detachably mount the fan to the heat sink and integrated circuit. An electrical connector with biased terminals is mounted on the fan, and the biased terminals engage corresponding terminals on the integrated circuit upon mounting the fan to the heat sink.

In U.S. Pat. No. 5,504,652, a unitary heat sink is formed of aluminum and includes a planar contact portion for contacting the top of an IC. A number of leg portions extend from the contact portion such that each leg portion has a distal end. The leg portions, being made of the same material as the contact portion, are configured to have a sufficient resiliency such that deformations of the leg portions provide a spring force in the range of 5 to 16 lbs. against the top of the IC.

In U.S. Pat. No. 5,584,339, a heat sink assembly for the central processor of a computer is provided in which the heat sink is selected from metal materials for good thermal conductivity. The heat sink comprises an array of heat conductive posts which define a free space for a fan. A number of grooves disposed between the posts are provided to engage a base plate. The fan is coupled to the base plate and can rotate in the free space. Two columns or rows of the heat conductive posts take the form of a hook such that the base plate when compressed can be engaged with these hooks. The base plate is provided with protrusions to secure to the grooves.

A present trend in the electronics industry is to provide systems not only to be thermally compatible, but more importantly to comply with acoustic requirements, i.e. noise. In addition, cost, component space and reliability requirements prohibit the use of auxiliary fans to be implemented in low-end, cost effective systems. Recent thermal arrangements pose a challenge to provide innovative solutions to thermal management of high power processors in the system.

Without an auxiliary fan in the system, and with the microprocessor residing adjacent a rear end of the chassis, there is a very low air velocity measured at the heat sink/processor interface. A great deal of simulation and experimentation has been performed to attempt to enhance the venting patterns on the power supply and the system chassis. The installation of an auxiliary fan is not always an acceptable solution because it increases the unit cost, noise, and introduces an added reliability concern.

Therefore, what is needed is a heat sink cooling device which does not rely on a fan supplement to enhance air flow across the heat sink and is capable of a self-generated increase in the flow of cooling air across the heat sink to enhance natural convection.

SUMMARY

One embodiment accordingly, provides a heat sink having a high pressure zone and an adjacent low pressure zone provided by a variable fin array which creates a natural "chimney" effect, high-to-low pressure gradient for enhanced air flow across the sink. To this end, a heat sink includes a heat sink base plate and a plurality of fins extending from the plate. First adjacent fins form a high pressure zone at a first end of the heat sink, wherein the first adjacent fins are separated by a first distance therebetween. Second adjacent fins form a low pressure zone at a second end of the heat sink, opposite the first end, wherein the second adjacent fins are separated by a second distance therebetween, greater than the first distance.

A principal advantage of this embodiment is that the pressure gradient heat sink performs a natural cooling draft by accelerating the movement of air from the high pressure zone, to the low pressure zone and to the ambient environment. Thus, the accelerated low velocity air flow enhances the natural convection of heat from the heat sink.

DETAILED DESCRIPTION OF THE PREFERRED EMBODIMENT

Figure 1:
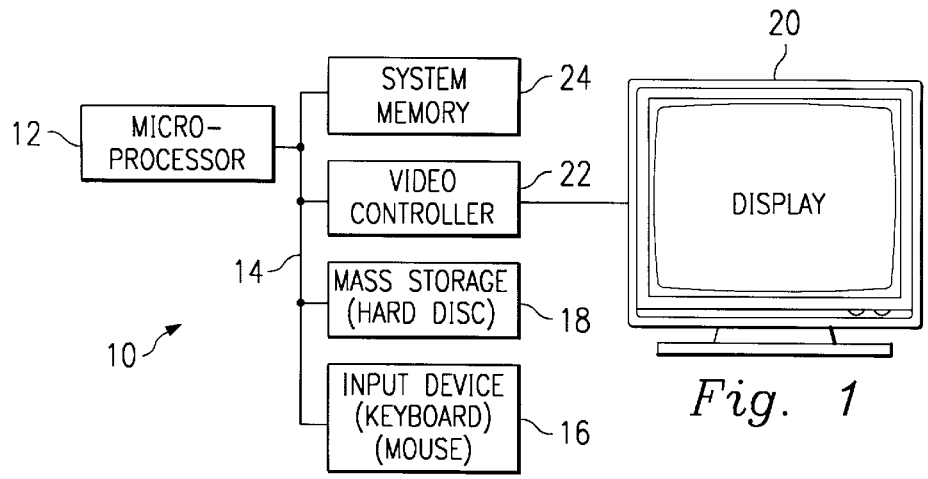
FIG. 1 is a diagrammatic view illustrating an embodiment of a computer system.

In one embodiment, computer system 10, FIG. 1, includes a microprocessor 12, which is connected to a buss 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
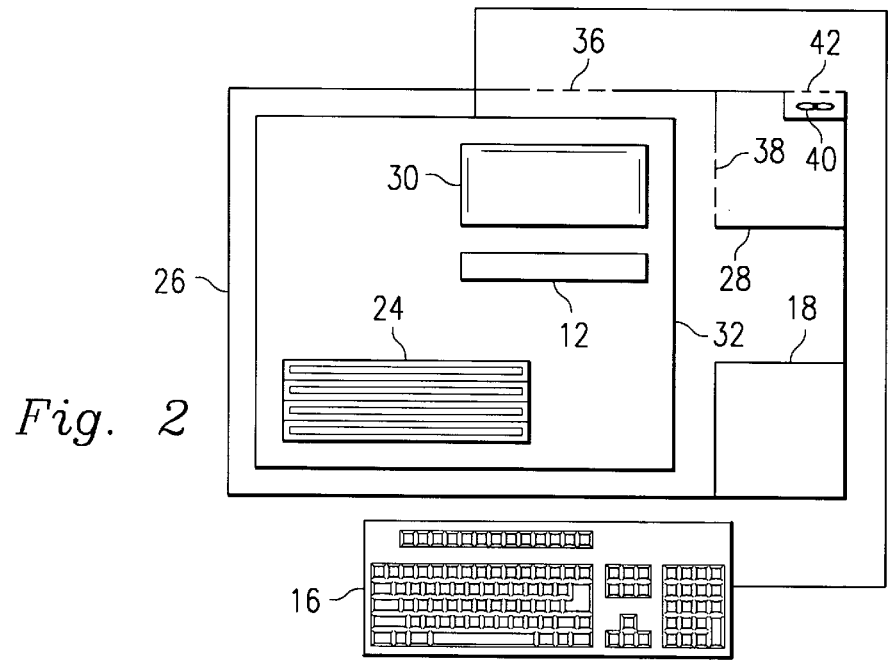
FIG. 2 is a diagrammatic view illustrating an embodiment of a computer chassis.

A chassis 26, FIG. 2, includes many components of computer system 10, such as for example, microprocessor 12, storage device 18 such as a hard drive, and system memory 24. Also included in chassis 26 is a power supply 28, a heat sink 30 mounted adjacent power supply 28 and also adjacent microprocessor 12. Input device 16 such as a keyboard, is positioned adjacent chassis 26 and is connected to a motherboard 32 which interconnects the components of system 10. Chassis 26 includes at least one vent 36 and power supply 28 also includes a vent 42 and a fan 40.

Figure 3:
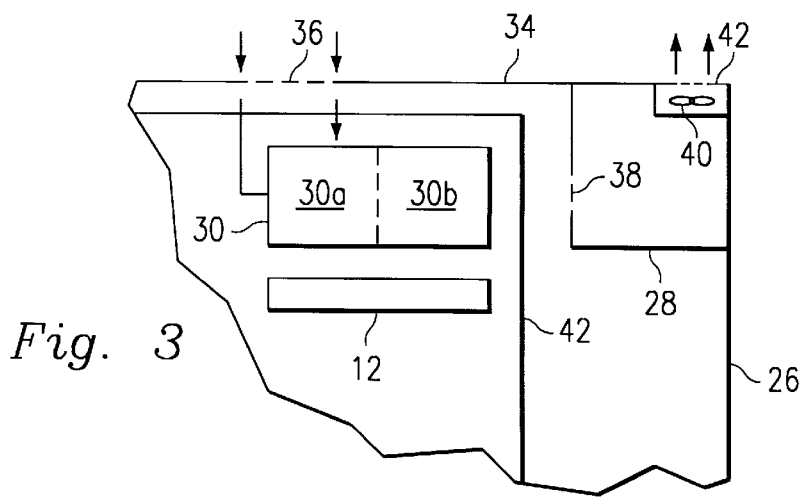
FIG. 3 is a diagrammatic view illustrating a portion of the chassis of FIG. 2.

In FIG. 3, a partial view of chassis 26 includes a rear wall 34 of chassis 26 which has the rear chassis vent 36 formed therein. Other vents (not shown) are also provided in other wall portions of chassis 26. Air flows into chassis 26 through rear vent 36 in the rear wall 34 and circulates within chassis 26. Various components within chassis 26 generate a substantial amount of heat during operation of the system 10. A large portion of the heat generated is provided by processor 12 mounted adjacent heat sink 30. Heat sink 30 includes a high pressure zone 30a and a low pressure zone 30b. The low pressure zone 30b is adjacent power supply 28 which includes an intake vent 38 and fan 40 which draws air through power supply 28 from intake vent 38 and exhausts the air through outlet vent 42 in rear wall 34 of chassis 26.

Figure 4:
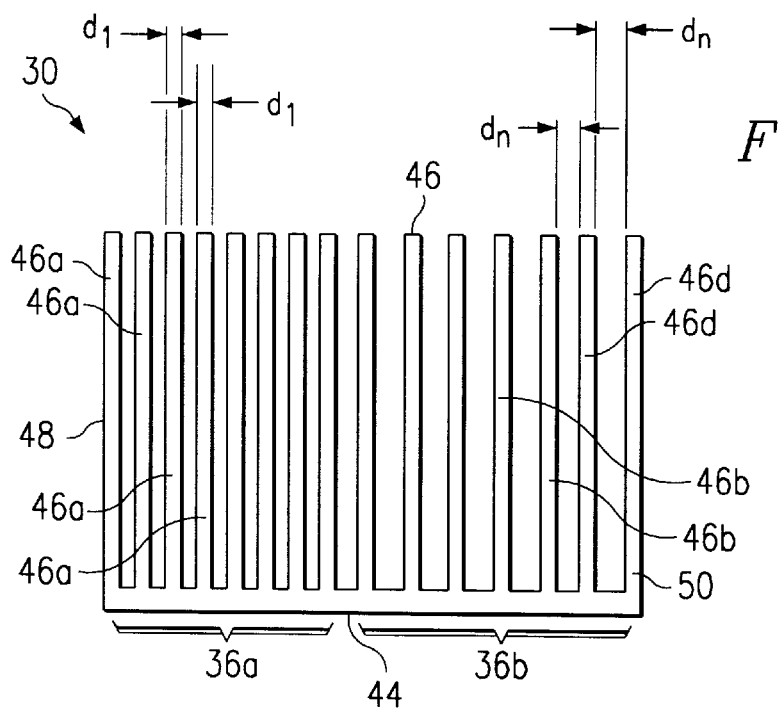
FIG. 4 is a side view illustrating an embodiment of a heat sink.

Heat sink 30, FIG. 4, includes a heat sink base plate 44 and a plurality of fins 46 extending from the base plate 44. Fins 46 include a plurality of first adjacent fins 46a, and additional adjacent fins 46a forming high pressure zone 36a at a first end 48 of heat sink 30. First and additional adjacent fins 46a, are separated by first distance dl, therebetween. Fins 46 also include a plurality of second adjacent fins 46b, and additional adjacent fins 46b, forming low pressure zone 36b at a second end 50 of heat sink 30. Second and additional adjacent fins 46b, are separated by a second distance $d_n$, therebetween, which is greater than first distance $d_1$.

Figure 5:
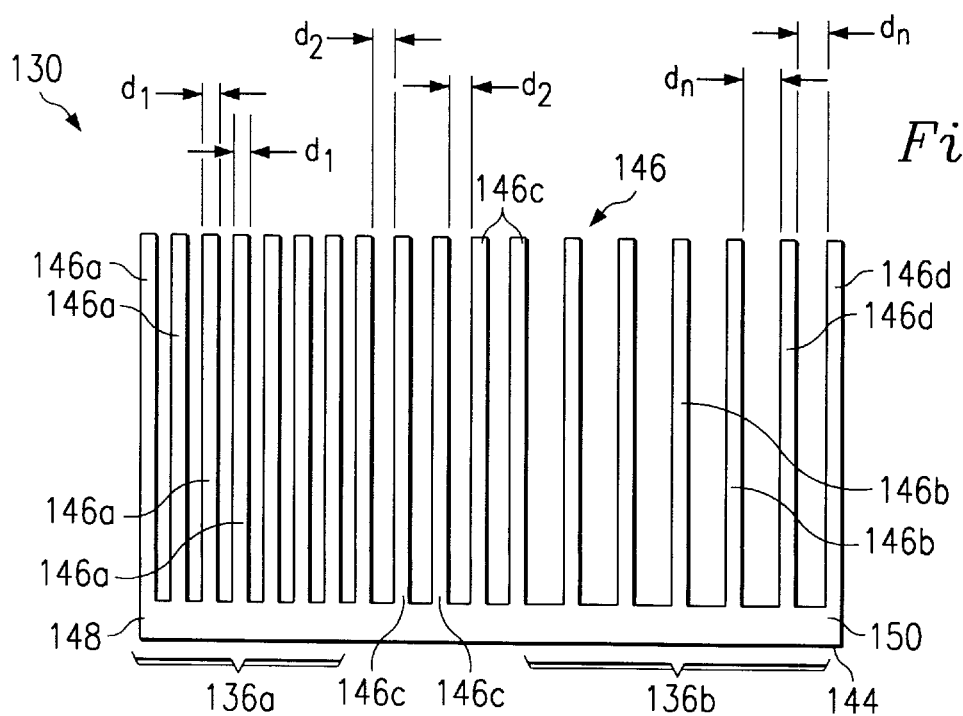
FIG. 5 is a side view illustrating another embodiment of a heat sink.

Heat sink 130, FIG. 5, includes a heat sink base plate 144 and a plurality of fins 146 extending from the base plate 144. Fins 146 include a plurality of first adjacent fins 146a, forming a high pressure zone 136a at a first end 148 of heat sink 130. First adjacent fins 146a, are separated by first distance $d_1$, therebetween. Fins 146 also include a plurality of second adjacent fins 146b, forming low pressure zone 136b at a second end 150 of heat sink 130. Second adjacent fins 146b, are separated by second distance $d_n$, therebetween, which is greater than first distance $d_1$. Heat sink 130 further includes additional adjacent fins 146c, between first adjacent fins 146a, and second adjacent fins 146b. The additional adjacent fins 146c are separated by an intermediate distance $d_2$ therebetween. The intermediate distance $d_2$ is greater than the first distance $d_1$ and less than the second distance $d_n$.

Figure 6:
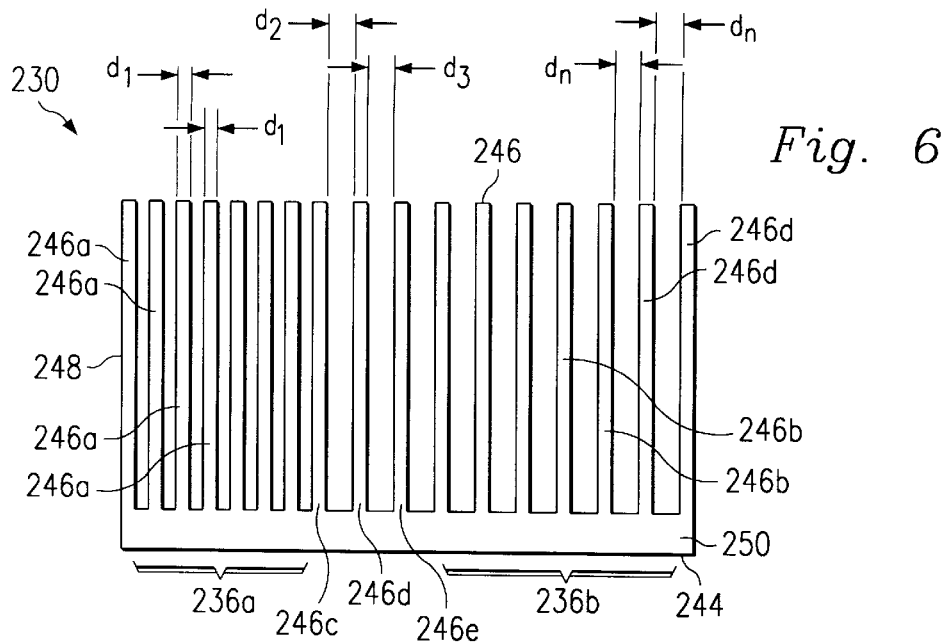
FIG. 6 is a side view illustrating a further embodiment of a heat sink.

Heat sink 230, FIG. 6, includes a heat sink base plate 244 and a plurality of fins 246 extending from the base plate 244. Fins 246 include a plurality of first adjacent fins 246a, forming a high pressure zone 236a at a first end 248 of heat sink 230. First adjacent fins 246a, are separated by first distance $d_1$, therebetween. Fins 246 also include a plurality of second adjacent fins 246b forming low pressure zone 236b at a second end 250 of heat sink 230. Second adjacent fins 246b, are separated by second distance $d_n$, therebetween, which is greater than first distance $d_1$. Heat sink 230 further includes additional adjacent fins 246c, 246d, 246e, between first adjacent fins 246a and second adjacent fins 246b. The additional adjacent fins 246c, 246d, 246e, are separated by a plurality of varying intermediate distances $d_2$, $d_3$ which are greater than the first distance $d_1$, and less than the second distance $d_n$.

Figure 7:
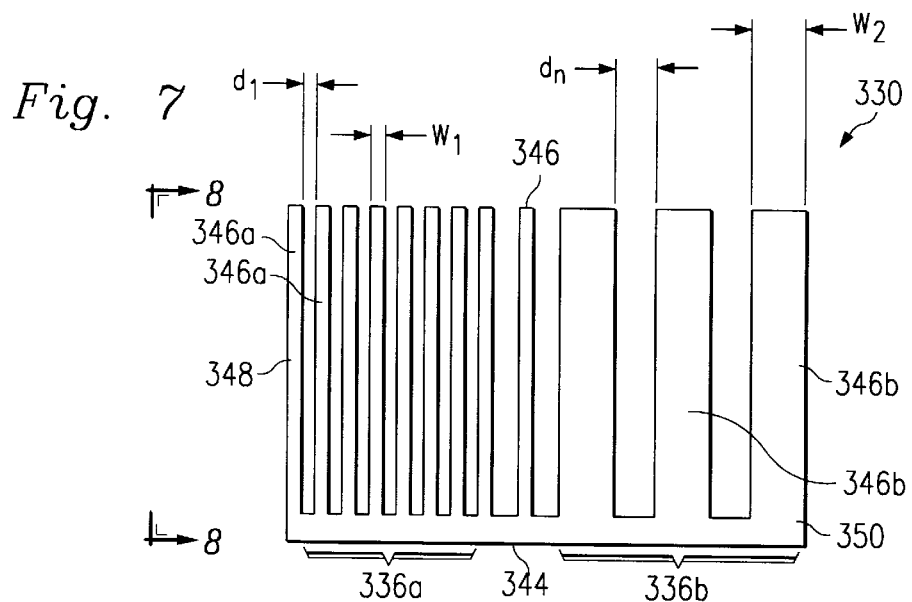
FIG. 7 is a side view illustrating a still further embodiment of a heat sink.

Heat sink 330, FIG. 7, includes a heat sink base plate 344 and a plurality of fins 346 extending from the base plate 344. Fins 346 include a plurality of first adjacent fins 346a, forming a high pressure zone 336a at a first end 348 of heat sink 330. First adjacent fins 346a are separated by first distance $d_1$, therebetween. Fins 346 also include a plurality of second adjacent fins 346b forming low pressure zone 336b at a second end 350 of heat sink 330. Second fins 346b, are separated by second distance $d_n$, therebetween, which is greater than first distance $d_1$. The first adjacent fins 346a have a first fin width $w_1$, and the second adjacent fins have a second fin width $w_2$, which is greater than the first fin width $w_1$.

Figure 8:
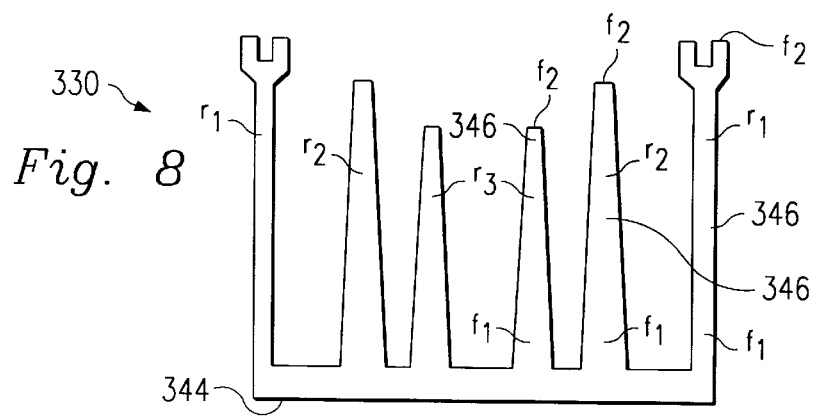
FIG. 8 is an end view illustrating the heat sink as viewed from the line 8—8 of FIG. 7.

Heat sink 330, FIG. 8, includes heat sink base plate 344 and fins 346 extending from base plate 344. The fins 346 have a first end $f_1$ attached to base plate 344 and a second terminal end $f_2$. In addition, the fins 346 are formed in a plurality of outside rows $r_1$ and a plurality of inside rows $r_2$ adjacent the outside rows $r_1$. Further inside rows $r_3$ may also be provided. The second terminal end $f_2$ of the fins 346 of the outside $r_1$ are bifurcated to provide additional surface area.

In operation, heat is generated by several components within the computer chassis. Air enters the chassis through vents in the chassis walls. The heat sink is adjacent the power supply and includes the high pressure zone and the low pressure zone, and is positioned so that the low pressure zone is adjacent the power supply. Heated air in the chassis moves across the heat sink in a natural draft from the high pressure zone to the low pressure zone resulting in a high-to-low pressure exhaustion of air from the low pressure end of the heat sink. The low velocity draft of air tends to travel freely in the high-to-low pressure gradient of the heat sink.

As it can be seen, the principal advantages of these embodiments are that the re-aligned fin array creates a natural chimney, high-to-low pressure gradient for air flow. The heat sink performs a natural draft cooling by pulling air from the high pressure end to the low pressure end and exhausting the air from the low pressure end to the environment. The resulting low velocity air tends to flow naturally in the high-to-low pressure gradient heat sink. Thus, the accelerated low velocity air flow enhances the natural convection of heat from the heat sink. The heat sink is easy to manufacture and at a low cost.

As a result, one embodiment provides a heat sink having a base plate and a plurality of fins extending from the base plate including first adjacent fins forming a high pressure zone at a first end of the heat sink. The first adjacent fins are separated from each other by a first distance. Second adjacent fins form a low pressure zone at a second end of the heat sink, opposite the first end. The second adjacent fins are separated from each other by a second distance, which is greater than the first distance.

Another embodiment provides a computer system including a chassis and a microprocessor mounted in the chassis. An input and a mass storage are coupled to the microprocessor. A display is coupled to the microprocessor by a video controller. A memory is coupled to provide storage to facilitate execution of computer programs by the microprocessor in the chassis. A heat sink has a base plate mounted adjacent the microprocessor. A plurality of fins extend from the base plate and include first adjacent fins forming a high pressure zone at a first end of the heat sink. The first adjacent fins are separated from each other by a first distance. Second adjacent fins form a low pressure zone at a second end of the heat sink, opposite the first end. The second adjacent fins are separated from each other by a second distance, greater than the first distance.

A further embodiment provides a method of accelerating natural air flow across a heat sink. A plurality of fins are extended from a heat sink base plate. A high pressure zone is formed at a first end of the heat sink by separating first adjacent fins by a first distance therebetween. A low pressure zone is formed at a second end of the heat sink, opposite the first end by separating second adjacent fins by a second distance therebetween, which is greater than the first distance.

A still further embodiment provides a pressure gradient heat sink having a heat sink base plate. Means extend from the base plate for providing a cooling draft by accelerating air movement from a high pressure zone of the heat sink to a low pressure zone of the heat sink. The high pressure zone includes a first finned array at a first end of the heat sink. The low pressure zone includes a second finned array, different from the first finned array, and positioned at a second end of the heat sink, opposite the first end.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A heat sink comprising:
    a heat sink base plate;
    a plurality of fins extending from the base plate including first adjacent fins forming a high pressure zone at a first end of the heat sink, wherein the first adjacent fins are separated by a first distance therebetween, and second adjacent fins forming a low pressure zone at a second end of the heat sink, opposite the first end, wherein the second adjacent fins are separated by a second distance, greater than the first distance; and
    additional adjacent fins in the high pressure zone, the additional adjacent fins in the high pressure zone being separated by the first distance.

2. The heat sink as defined in claim 1 further comprising additional adjacent fins in the low pressure zone, the additional adjacent fins in the low pressure zone being separated by the second distance.

3. The heat sink as defined in claim 1 further comprising additional adjacent fins between the first adjacent fins and the second adjacent fins, the additional adjacent fins being separated by an intermediate distance therebetween, the intermediate distance being greater than the first distance and less than the second distance.

4. The heat sink as defined in claim 1 further comprising additional adjacent fins between the first adjacent fins and the second adjacent fins, the additional adjacent fins being separated by a plurality of varying intermediate distances which are greater than the first distance and less than the second distance.

5. A computer system comprising:
    a chassis;
    a microprocessor in the chassis;
    an input coupled to provide input to the microprocessor;
    a mass storage coupled to the microprocessor in the chassis;
    a display coupled to the microprocessor by a video controller;
    a memory coupled to provide storage to facilitate execution of computer programs by the microprocessor in the chassis;
    a heat sink having a base plate mounted adjacent the microprocessor;
    a plurality of fins extending from the base plate including first adjacent fins forming a high pressure zone at a first end of the heat sink, wherein the first adjacent fins are separated by a first distance therebetween and second adjacent fins forming a low pressure zone at a second end of the heat sink opposite the first end, wherein the second adjacent fins are separated by a second distance therebetween, greater than the first distance; and
    a power supply mounted in the chassis, the heat sink mounted adjacent the power supply.

6. The computer system as defined in claim 5 wherein the low pressure zone is mounted adjacent the power supply.

7. The computer system as defined in claim 5 wherein the power supply includes a vent formed therein for permitting the passage of air therethrough, the low pressure zone being mounted adjacent the air vent.

8. The heat sink as defined in claim 5 further comprising additional adjacent fins in the high pressure zone, the additional adjacent fins in the high pressure zone being separated by the first distance.

9. The heat sink as defined in claim 5 further comprising additional adjacent fins in the low pressure zone, the additional adjacent fins in the low pressure zone being separated by the second distance.

10. The heat sink as defined in claim 5 further comprising additional adjacent fins between the first adjacent fins and the second adjacent fins, the additional adjacent fins being separated by an intermediate distance therebetween, the intermediate distance being greater than the first distance and less than the second distance.

11. The heat sink as defined in claim 5 further comprising additional adjacent fins between the first adjacent fins and the second adjacent fins, the additional adjacent fins being separated by a plurality of varying intermediate distances which are greater than the first distance and less than the second distance.

12. A method of accelerating natural air flow across a heat sink comprising the steps of:
    extending a plurality of fins from a heat sink base plate;
    forming a high pressure zone at a first end of the heat sink by separating first adjacent fins by a first distance therebetween;

forming a low pressure zone at a second end of the heat sink, opposite the first end, by separating second adjacent fins by a second distance therebetween, greater than the first distance;

forming additional adjacent fins in the high pressure zone being separated by the first distance; and forming other additional adjacent fins in the low pressure zone being separated by the second distance.

13. A pressure gradient heat sink comprising:

a heat sink base plate;

means extending from the base plate for providing a cooling draft by accelerating air movement from a high pressure zone of the heat sink to a low pressure zone of the heat sink, the high pressure zone including a first finned array being at a first end of the heat sink, and the low pressure zone including a second finned array, different from the first finned array, being at a second end of the heat sink, opposite the first end;

the first finned array including a plurality of first adjacent fins separated by a first distance therebetween;

the second finned array including a plurality of second adjacent fins separated by a second distance therebetween greater than the first distance; and additional adjacent fins in the high pressure zone being separated by the first distance.

14. The pressure gradient heat sink as defined in claim 13 further comprising additional adjacent fins in the low pressure zone being separated by the second distance.

15. The pressure gradient heat sink as defined in claim 13 further comprising additional adjacent fins between the first adjacent fins and the second adjacent fins, the additional adjacent fins being separated by an intermediate distance therebetween, the intermediate distance being greater than the first distance and less than the second distance.

16. The pressure gradient heat sink in claim 13 further comprising additional adjacent fins between the first adjacent fins and the second adjacent fins, the additional adjacent fins being separated by a plurality of varying intermediate distances which are greater than the first distance and less than the second distance.

* * * * *